(12) United States Patent
Reid et al.

(10) Patent No.: US 8,319,523 B2
(45) Date of Patent: Nov. 27, 2012

(54) CHIP INTERFACE

(75) Inventors: Stephen R. Reid, Ayer, MA (US); David J. Katz, Andover, MA (US)

(73) Assignee: Raytheon Company, Waltham, MA (US)

( * ) Notice: Subject to any disclaimer, the term of this patent is extended or adjusted under 35 U.S.C. 154(b) by 94 days.

(21) Appl. No.: 12/821,730

(22) Filed: Jun. 23, 2010

(65) Prior Publication Data
US 2011/0316594 A1 Dec. 29, 2011

(51) Int. Cl.
*H03K 19/00* (2006.01)
*H03K 19/094* (2006.01)
*H03K 3/356* (2006.01)

(52) U.S. Cl. ............................. 326/93; 326/83; 327/208
(58) Field of Classification Search .................... 326/93, 326/95, 98, 81, 83; 327/208–212, 214, 215, 327/224, 225; 716/100
See application file for complete search history.

(56) References Cited

U.S. PATENT DOCUMENTS

| | | | |
|---|---|---|---|
| 5,859,605 A | 1/1999 | Raghavan et al. | |
| 6,874,107 B2 | 3/2005 | Lesea | |
| 6,909,536 B1* | 6/2005 | Walker et al. | 359/337 |
| 7,054,356 B2* | 5/2006 | Wahl | 375/219 |
| 7,222,208 B1* | 5/2007 | Haycock et al. | 710/305 |
| 7,583,753 B2* | 9/2009 | Okamura | 375/296 |
| 7,735,037 B2 | 6/2010 | Tell | |
| 8,013,634 B2* | 9/2011 | Whetsel | 326/86 |
| 2002/0167345 A1 | 11/2002 | Iijima | |
| 2003/0023912 A1 | 1/2003 | Lesea | |
| 2004/0202254 A1* | 10/2004 | Segaram | 375/257 |
| 2005/0089088 A1 | 4/2005 | Fukasawa et al. | |
| 2006/0165186 A1* | 7/2006 | Segaram | 375/257 |
| 2007/0283297 A1* | 12/2007 | Hein et al. | 716/1 |
| 2008/0104456 A1* | 5/2008 | Talbot | 714/704 |
| 2009/0015304 A1 | 1/2009 | Yin et al. | |
| 2010/0271092 A1* | 10/2010 | Zerbe et al. | 327/161 |

OTHER PUBLICATIONS

Torza, "Xilinx Serial Roadmap 40G and 100G Applications with Virtex®-6 and Virtex®-5 TXT FPGAs", 44 pages, from pdf at www.xilinx.com/events/seminars/highperformance/presentations/40g_100_apps_at_v5. pdf. Saved Feb. 3, 2009.
Notification of Transmittal of the International Search Report and the Written Opinion of the International Searching Authority, or the Declaration, PCT/US2011/038850, date of mailing Oct. 11, 2011, 5 pages.
Written Opinion of the International Searching Authority, PCT/US2011/038850, date of mailing Oct. 11, 2011, 8 pages.
Chuang E et al., "A Highly Capable Arbitrary Waveform Generator for Next Generation Radar Systems", 2006 IEEE Aerospace Conference; Big Sky, Montana; Mar. 4-11, 2006, Jet Propulsion Laboratory, National Aeronautics and Space Administration, Pasadena, CA, USA, Mar. 4, 2006. XP010928483. pp. 1-7.

* cited by examiner

*Primary Examiner* — Shawki S Ismail
*Assistant Examiner* — Dylan White
(74) *Attorney, Agent, or Firm* — Daly, Crowley, Mofford & Durkee, LLP

(57) ABSTRACT

In one aspect, an integrated circuit (IC) system includes a receiver IC configured to receive a first clock signal and includes a feedback circuit to provide a feedback signal to a driver IC. The system also includes the driver IC configured to receive a second clock signal and includes a phase selection circuit configured to provide a phase selection signal to the receiver IC based on the feedback signal. The phase selection signal controls the data received by the receiver IC by adjusting the first clock signal.

21 Claims, 10 Drawing Sheets

CHIP INTERFACE

BACKGROUND

Integrated circuits (ICs) (also known as chips) are capable of providing transistors that have an operating frequency of 1 GHz or more if these transistors are fabricated using the proper materials. Generally, silicon material is not capable of producing as high frequency transistors compared to indium phosphide (InP), for example. However, these other materials yield a lower number of transistors as compared to silicon transistors.

SUMMARY

In one aspect, an integrated circuit (IC) system includes a receiver IC configured to receive a first clock signal and includes a feedback circuit to provide a feedback signal to a driver IC. The system also includes the driver IC configured to receive a second clock signal and includes a phase selection circuit configured to provide a phase selection signal to the receiver IC based on the feedback signal. The phase selection signal controls the data received by the receiver IC by adjusting the first clock signal.

In another aspect, a driver integrated circuit (IC) includes a phase selection circuit configured to provide a phase selection signal to a receiver IC based on a feedback signal received from the receiver IC.

In a further aspect, a receiver integrated circuit (IC) includes a feedback circuit configured to provide a feedback signal to a driver IC. The receiver IC is configured to receive a phase selection signal from the driver circuit based on the feedback signal.

DETAILED DESCRIPTION

Figure 1:
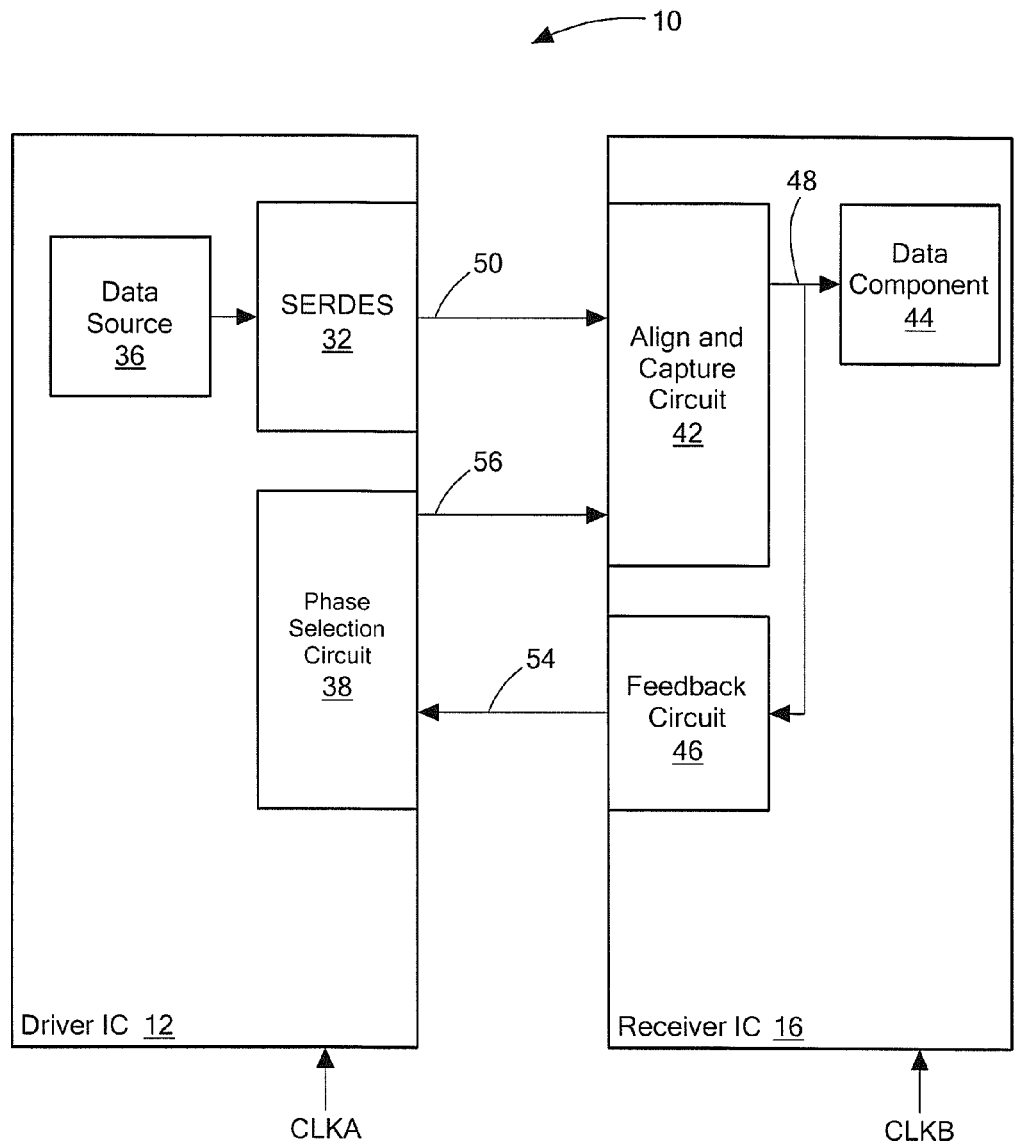
FIG. 1 is a block diagram of an integrated circuit (IC) system.

Transistors that operate above and well above 10 GHz are useful in several applications, for example, radars. However, some materials that produce these higher speed transistors yield a low number of transistors. One way to address this limitation is to use a multiple integrated circuit (IC) solution. Even though as will be described herein is a two-IC system (sometimes referred to as a two-chip system), the multiple IC solution is not limited by the number of ICs. In one example, a first IC is made from a material that yields a high number of transistors, for example, silicon. A second IC such as one made of InP or GaN is used to fabricate the higher frequency transistors (e.g., having a current gain cutoff frequency, $f_t$, and a maximum frequency of oscillation, $f_{MAX}$, each above 250 GHz). Thus, a majority of the transistors can be fabricated on one IC with material that has a high yield of transistors while the higher frequency transistors can be fabricated on a second IC.

As used herein the current gain cutoff frequency, $f_t$, is the frequency at which the current gain of an active device falls to 1 and the maximum frequency of oscillation, $f_{MAX}$, is the maximum frequency at which it is possible to make an oscillator out of a given device, and is usually equivalent to the frequency where the power gain of the device is unity.

However, there is a challenge in transferring data between the two ICs. For example, parallel data can be reliably transmitted between chips at speeds up to ~3.5-4.0 GHz, but not higher. For higher frequency data transfer, one can transmit K sets of parallel lines between the two chips at relatively low frequency (i.e., below 4 GHz) and then multiplex the K sets of data together in a receiver chip, but this approach requires more transistors in the receiver chip. For example, Low Voltage Differential Signal (LVDS) buffers operate at up to about 1.4 GHz, would require an 8:1 multiplexer in the destination IC to achieve 11.2 G Samples/sec. The 8:1 multiplexer on each data link in the destination IC could negatively impact reasonable yield. Also, the 8:1 multiplexing of each differential data link for a 16 bit data word requires (16*8*2) =256 pads, where increasing pad count often is another reduction to yield. A faster interface than LVDS is the Serializer Deserializer (SERDES) Multi-Gigabit Transceiver (MGT) type which is offered in FPGAs and other CMOS ICs. The MGT supports many protocol and standard interfaces, however uses a lot of resources in the receiving IC which could have low resource availability. The ICs with MGT interfaces normally use protocol, encoding (such as 8/10b), clock recovery, channel synchronization (of multiple data links), memory storage buffer synchronization, and other logic which could become prohibitive to fit in a receiver IC with low resource availability. As will be further described herein, a transfer of data is accomplished from a driver IC to a receiver IC which uses less receiver transistors and pin count than prior art approaches when the clocks of each of the two interfacing chips are coherent.

Referring to FIG. 1, a two-IC system 10 includes a driver IC 12 and a receiver IC 16. The driver IC 12 is sometimes referred to as a driver chip because data originates from the driver IC 12 and is transferred elsewhere, for example, to the receiver IC 16. In one example, the driver IC refers to an IC that is generally resources rich as compared to the receiver IC 16. In one example, the driver IC 12 is a field-programmable gate array (FPGA) fabricated using silicon, for example. In another example, the driver IC 12 is an application-specific integrated circuit (ASIC) fabricated using silicon, for example. In a further example, the driver circuit 12 includes CMOS devices. As used herein, the receiver IC 16 refers to an IC that includes transistors that are generally operated at frequencies above 1 GHz.

In one example, the receiver IC 16 is fabricated using InP or GaN, for example. In one example, the receiver IC 16 includes heterojunction bipolar transistors (HBTs). Using InP for transistor fabrication has significant advantages. The advantages include but are not limited to being more cost effective than SiGe for low volume (<100K units); having a low $V_{BE}$ (e.g., 220 mV lower than silicon and 780 mV lower than GaAs), which is advantageous to low voltage operation; having a high breakdown voltage (e.g., 3:1 better than SiGe for a given bandwidth), which is advantageous to improved dynamic range; having the highest frequency/power figure of merit (FOM) at high frequency; and having higher $f_t$ and $f_{max}$ than SiGe or GaAs.

The driver IC 12 includes a serializer/deserializer (SERDES) 32, a data source 36 and a phase selection circuit 38. The data source 36 provides data signals. In one example, the data source 36 is a digital waveform generator portion of a synthesizer such as an arbitrary waveform generator or a direct digital synthesizer. The driver IC 12 receives a clock signal, CLKA.

The receiver IC 16 (sometimes referred to as the receiver or receive chip) includes an align and capture circuit 42, a data component 44 and a feedback circuit 46. The receiver IC 16 receives a clock signal, CLKB. In one example, CLKB is equal to or a multiple of the clock signal CLKA. In one particular example, the clock signal CLKA may be provided from dividing down the clock signal CLKB. The data generated by the data source 36 is used by the data component 44. In one example, the data component 44 is a Digital-to-Analog Converter (DAC). In one example, the data component 44 is the DAC used to provide data to a radar system (not shown).

Data is generated by the data source 36 and sent to the SERDES 32. Data, DD, which may include data and differential data, is sent by the SERDES 32 to the align and capture circuit 42 over a connection 50 having M channels where M>1. As used herein, differential data means that one data channel is made up of two signals (and connection traces) which allows for faster switching. There are multiple differential standards. For example, Current Mode Logic (CML) differential buffers are usually used for the gigabit transceivers of FPGA, which sends out the SERDES data from SERDES 32. CML logic states are based on whether the differential output voltage swing between the data pair is over a specific threshold. The align and capture circuit 42 provides an output signal via connection 48 to the feedback circuit 46 and to the data component 44 for processing. The feedback circuit 46 sends a feedback signal via a connection 54 to the phase selection circuit 38. In one example, the feedback signal 54 depends on whether the bits of the data signal DD are aligned. Using multiple feedback signals, where each feedback signal represents a subset of the parallel data inputs (DD), allows reduced time needed to align all data (DD).

The various connections described herein may be referred to herein interchangeably with the signal carried by the respective connection. For example, reference character 54 may be used interchangeably to refer to the connection between the phase selection circuit 38 and the feedback circuit 46 and to the feedback signal associated with such a connection.

Based on the feedback signal 54, the phase selection circuit 38 provides phase selection signals, via a connection 56 having M channels, to the align and capture circuit 42 to control the capture time of the data signals. In one example, the phase selection circuit 38 also provides calibrates signals to the SERDES 32. As will be described in conjunction with FIG. 2 the phase select signal 56*a* selects the clock signal CLKB for capturing data.

In one particular example, the data differential signals DD are provided one-bit per channel so that for M-bits there are M channels. For example, data DD includes a first bit, $DD_1$, a second bit, $DD_2$, ..., and an Mth bit, $DD_M$.

In the arrangement described in FIG. 1, the receiver IC 16 receives high speed serial data with a greatly reduced transistor count using less circuitry than a conventional SERDES receiver. The data align and capture is accomplished without the data decoding and the clock recovery circuit (wherein the clock is generated from the data) which are often included in conventional SERDES receivers. Also, multiple high speed serial data lines for parallel digital data are used without protocol such as "channel bonding" and packet overhead, for example.

Figure 2:
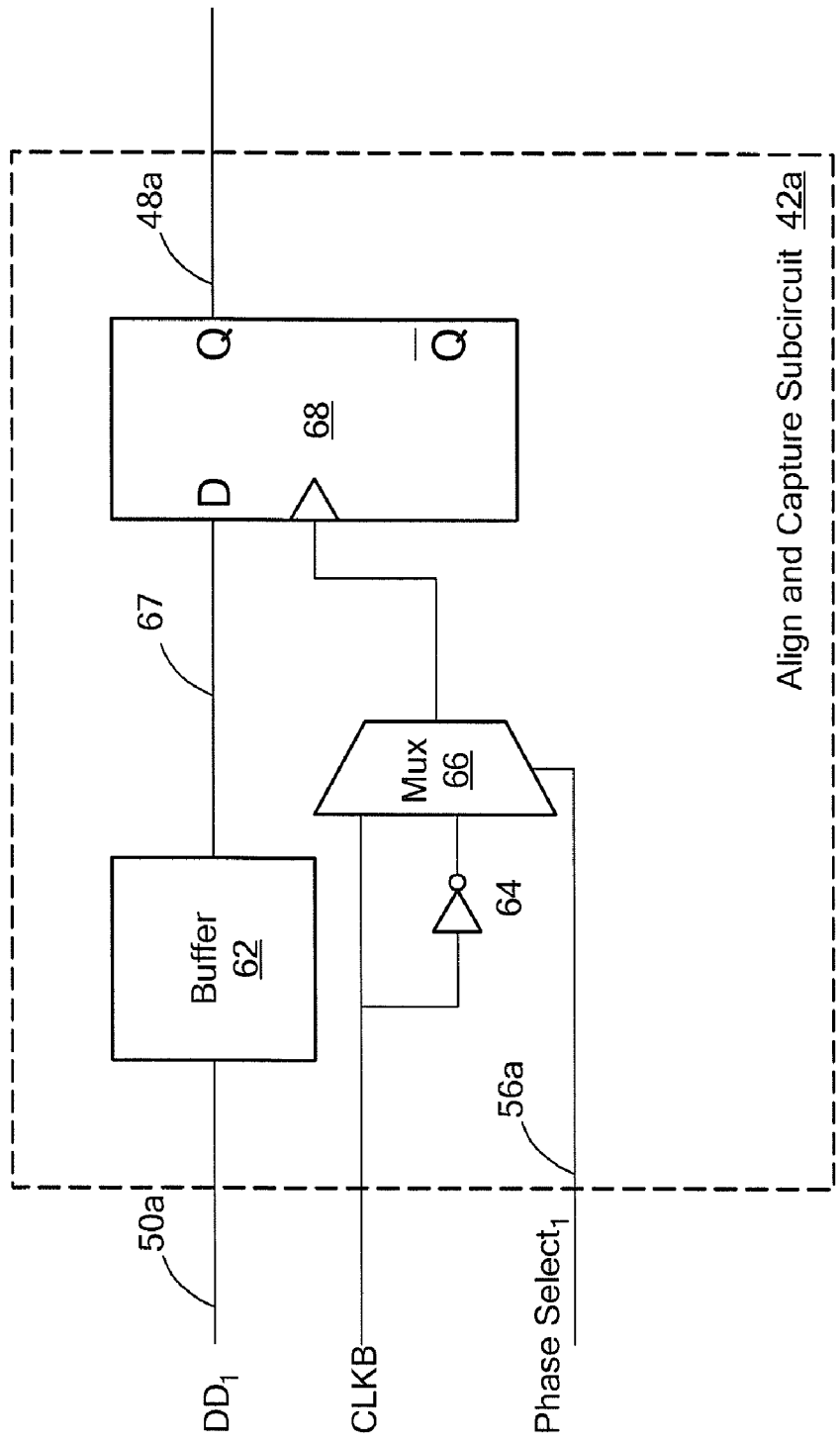
FIG. 2 is a block diagram of a portion of an align and capture circuit.

Referring to FIG. 2, an example of a portion of the align and capture circuit 42 is an align and capture subcircuit 42*a*. The align and capture subcircuit 42*a* processes the first bit of the data signal $DD_M$. The align and capture subcircuit 42*a* includes a buffer 62, an inverter 64, a multiplexer 66 and D flip-flop 68. The buffer 62 receives the first bit $DD_1$ of the data DD. The output of the buffer 62 is a signal DB which supplies the D port of the D flip-flop 68 through a connection 67. The signal DB corresponds to the signal DD bit for bit so that $DD_M$=$DB_M$. The multiplexer 66 receives the clock signal CLKB and the inverted clock signal from the inverter 64. The multiplexer 66 is controlled by a Phase Select$_1$ signal 56*a* which corresponds to the first bit signal of the phase select signal 56. Thus, the Phase Select$_1$ signal 56*a* selects whether to utilize the leading or falling edge of CLKB for clocking data into the D flip-flop of the first bit $DD_1$. The output of the multiplexer 66 controls the clock of the D flip-flop 68. The output port Q of the D flip-flop 68 is an output signal 48*a* which is part of the output signal 48. One of ordinary skill in the art would recognize that the align and capture subcircuit 42*a* in the align and capture circuit 42 is duplicated for each bit in the data signal DD. Optionally, the component 64 could be used once for all data channels to provide 180 degree clock phase selection to control data capture in all the D flip-flops of the align and capture circuit.

Figure 3:
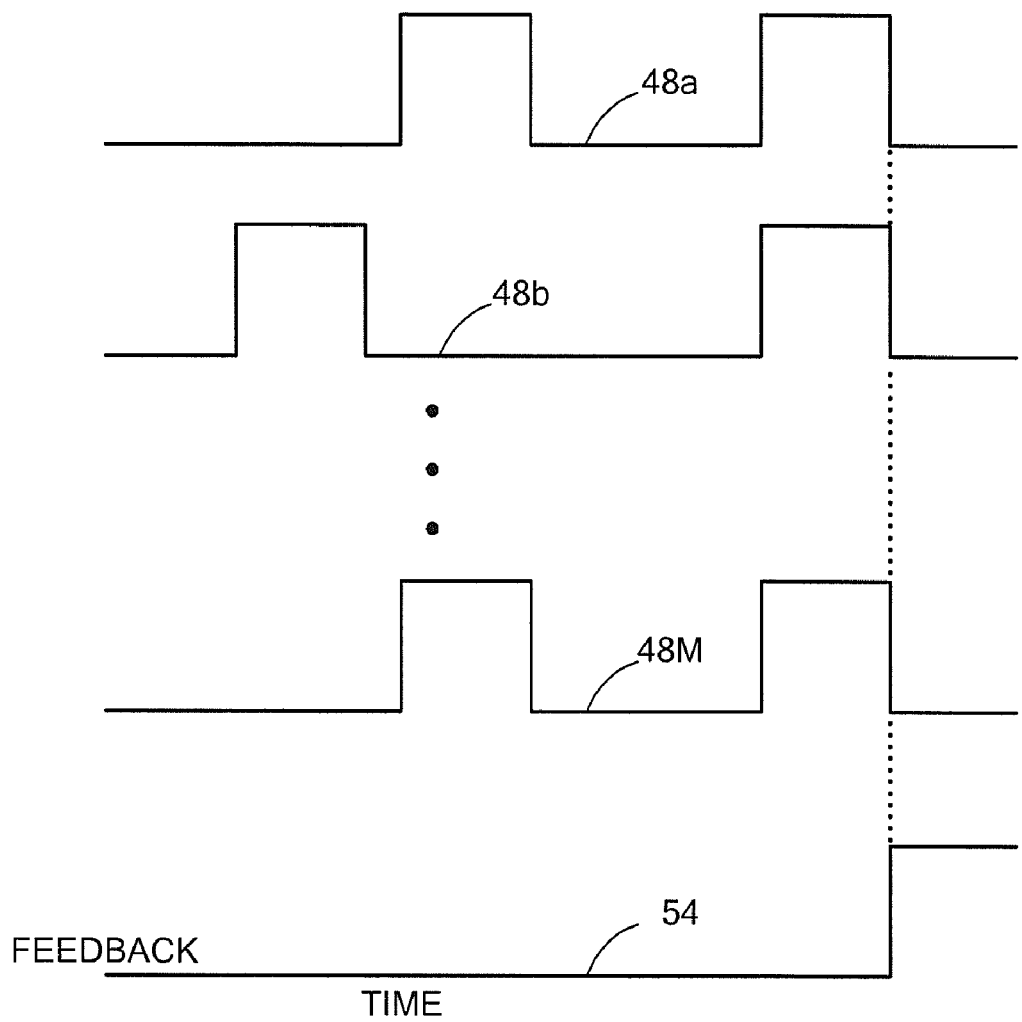
FIG. 3 is a diagram of the signals including differential data signals and a feedback signal.

Referring to FIG. 3, in one example the feedback signal 54 depends on the alignment of the data signals at the output of the D flip flops of the align and capture circuit. For example, when the outputs of a group of M number of D flip-flops are aligned, the feedback signal 54 toggles, for example, from a logical "0" to a logical "1" (as shown in FIG. 3) or in another example from a logical "1" to a logical "0" (not shown in FIG. 3). The toggling allows a slower clock in the driving IC to detect the feedback signal assuming a sequence of 0 data values are transmitted with a 1 value near the middle of each data sequence.

Figure 4:
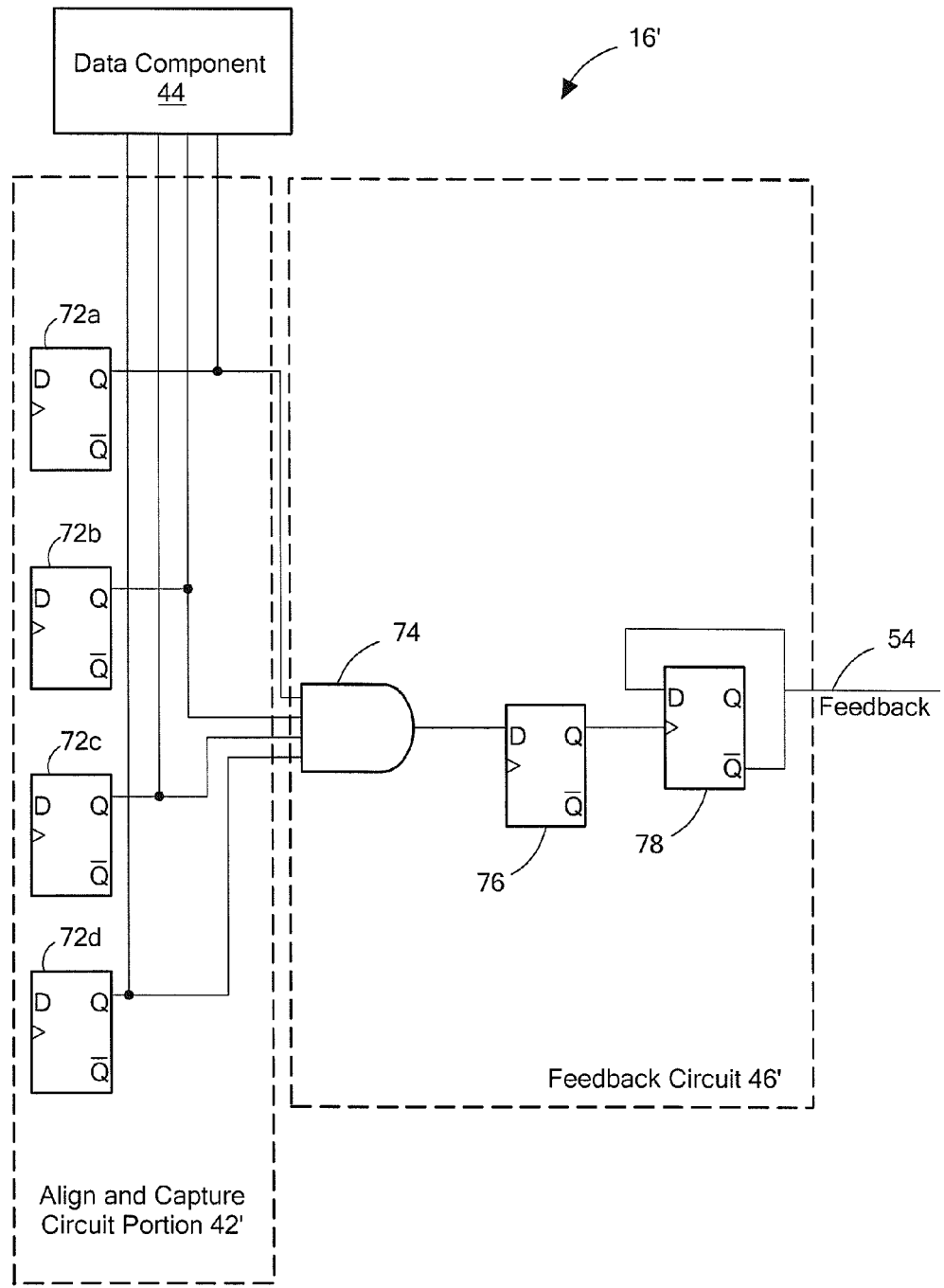
FIG. 4 is a block diagram of an example of a receiver IC with a feedback circuit.

Referring to FIG. 4, one example of the receiver IC 16 is a receiver IC 16'. The receiver IC 16' includes a data component 44, an align and capture circuit portion 42' (an example of a portion of the align and capture circuit 42) and a feedback circuit 46' (an example of a feedback circuit 46). The feedback circuit 46' corresponds to an example of the data signal DD having 4 bits. The align and capture circuit 42' includes four D flip-flops 72*a*-72*d*. The feedback circuit 46' includes an AND gate 74, a D flip-flop 76 and a D flip-flop 78. The D ports of each flip-flop 72*a*-72*d* receives one bit of data. Each Q port of the D flip-flops 72*a*-72*d* supplies the input of the AND gate 74. The output of the AND gate 74 provides the input for the D port of the D flip-flop 76. The Q port of the D flip-flop 76 supplies the clock port of the D flip-flop 78. With respect to the D flip-flop 78, the inverse Q port is tied to the D port and the Q port provides the feedback 54.

Figure 5:
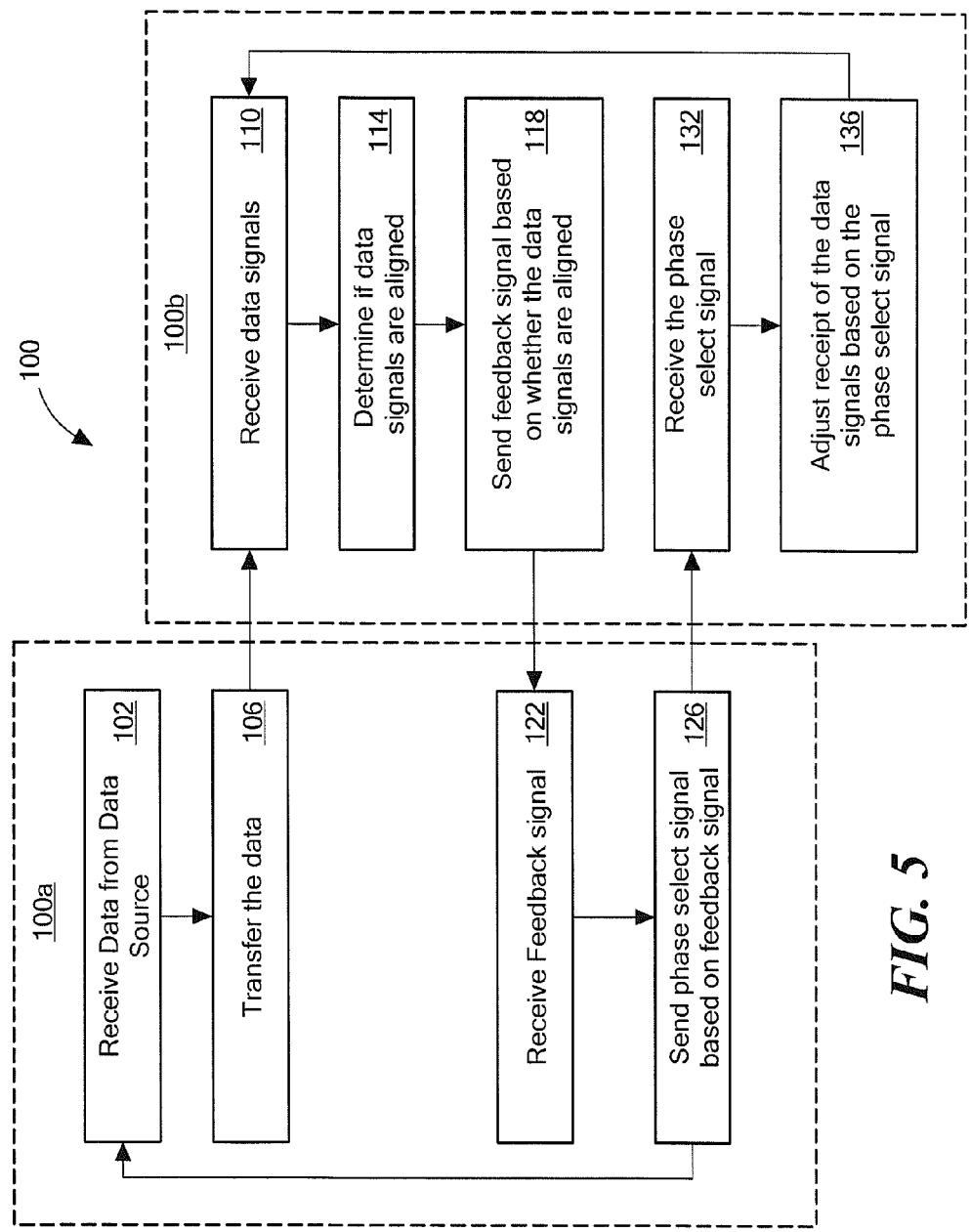
FIG. 5 is a flowchart of an example of a process to transfer data between the ICs in the IC system of FIG. 1.

Referring to FIG. 5, one example of a process to operate two-ICs in the two-IC system is a process 100. In this example, the driver IC 12 performs the subprocess 100*a* of the process 100 and the receiver IC 16 performs the subprocess 100*b* of the process 100.

Data is received from the data source (102). For example, the SERDES 32 receives the data signals from the data source 36.

The data signals are transferred (106). For example, the data signals DD are transferred from the SERDES 32 to the receiver IC 16 over the connection 50. In another example, in addition to sending the phase select signal, the driver IC 12 may also transfer data earlier or later. In particular, the SERDES 32 includes a parallel interface (not shown), for example, 16 bits, and drives all those bits out. Based on the feedback signal 54, the SERDES 32 circuit would advance or delay the data output by one or more clock cycles on one or more of the parallel data lines. The phase selection circuit 38 can signal a change in the clock phase to be utilized to capture one or more data inputs to the receiver IC 16. Thus, depending on the implementation, several clock pipeline delays may be tested. A course correction is performed at startup (for example, at power up), followed by a periodic smaller pipeline moving of data bits earlier and later to account for temperature and voltage variations.

The data is received (110). For example, the align and capture circuit 42 receives the data signals DD. It is determined if the data signals are aligned (114). In one example, the feedback circuit 46 determines the data signals are aligned if all the latched data signals are aligned. A feedback signal is sent based on whether data signals are aligned (118). For example, the feedback signal 54 is sent by the feedback circuit 46.

The feedback signal is received (122) by the driver IC 12. For example, the feedback signal 54 is received by the phase selection circuit 38. A phase select signal is sent based on the feedback signal (126). For example, the phase selection circuit 38 sends the phase select signal 56 to the receiver IC 16.

The phase select signal is received (132) by the receiver IC 16. For example, the phase select signal 56 is received by the align and capture circuit 42. The data signal DD received is adjusted based on the phase select signal 56. For example, the phase select signal 56 adjusts the phase of the clocking signal CLKB controlling the receipt of the data DD.

Figure 6:
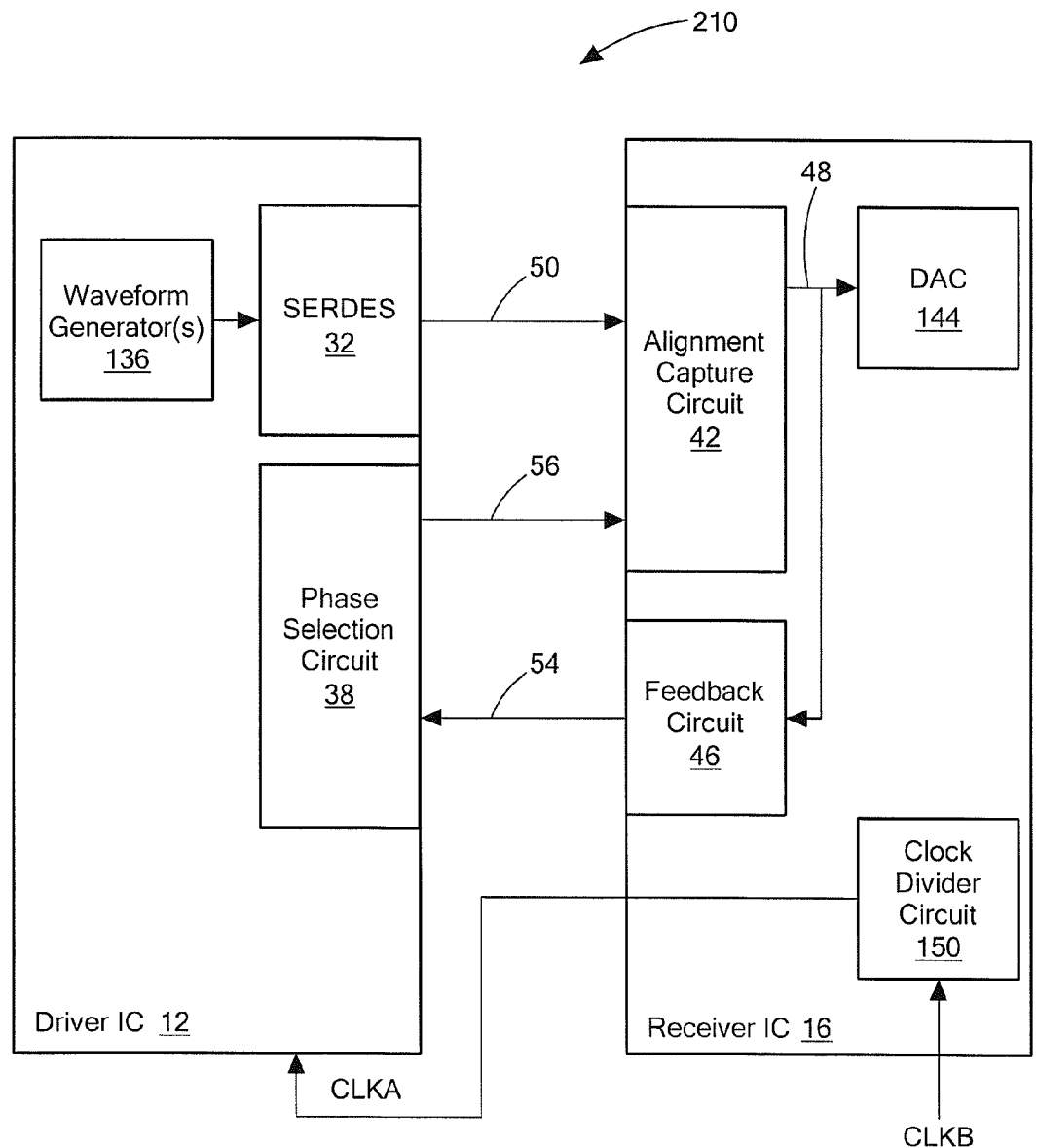
FIG. 6 is a block diagram of one example of the IC system.

Referring to FIG. 6, in one example, the two-IC system 10 may be implemented as two-IC system 210. The two-IC system 210 includes waveform generators 136 as the data source 36 in the driver IC 12. The two-IC system 210 also includes a digital-to-analog converter (DAC) 144 as the data component 44 in the receiver IC 16. In one example, the DAC is used to synthesize an analog waveform. In one example, the DAC 144 is a Return To Zero (RZ) DAC. The RZ mode allows operating in the second Nyquist zone with a higher amplitude output than is available with a non-return to zero DAC. The RZ DAC thus allows lower clock rates to provide waveform generation in a high frequency range.

In one example, the waveform generators 136 are reprogrammable arbitrary waveform generators (AWFGs). In one particular example, the waveform generators are digital AWFGs. In other examples, the waveform generators 136 provide multiple tones, notch filtering, amplitude pre-distortion, phase encoded modulation and pseudo random waveform generation.

The two-IC system 210 further includes a clock divider circuit 150 in the receiver IC 16. In one example, the clock speed CLKB is 11.2 GHz and the clock divider circuit 150 divides the clock speed CLKB by 16 to 700 MHz which is provided to the driver circuit 12 as a clock signal CLKA. The data signals D and the differential data signals D' are each provided by the SERDES 32 CML transceiver at 11.2 GHz.

Figure 7:
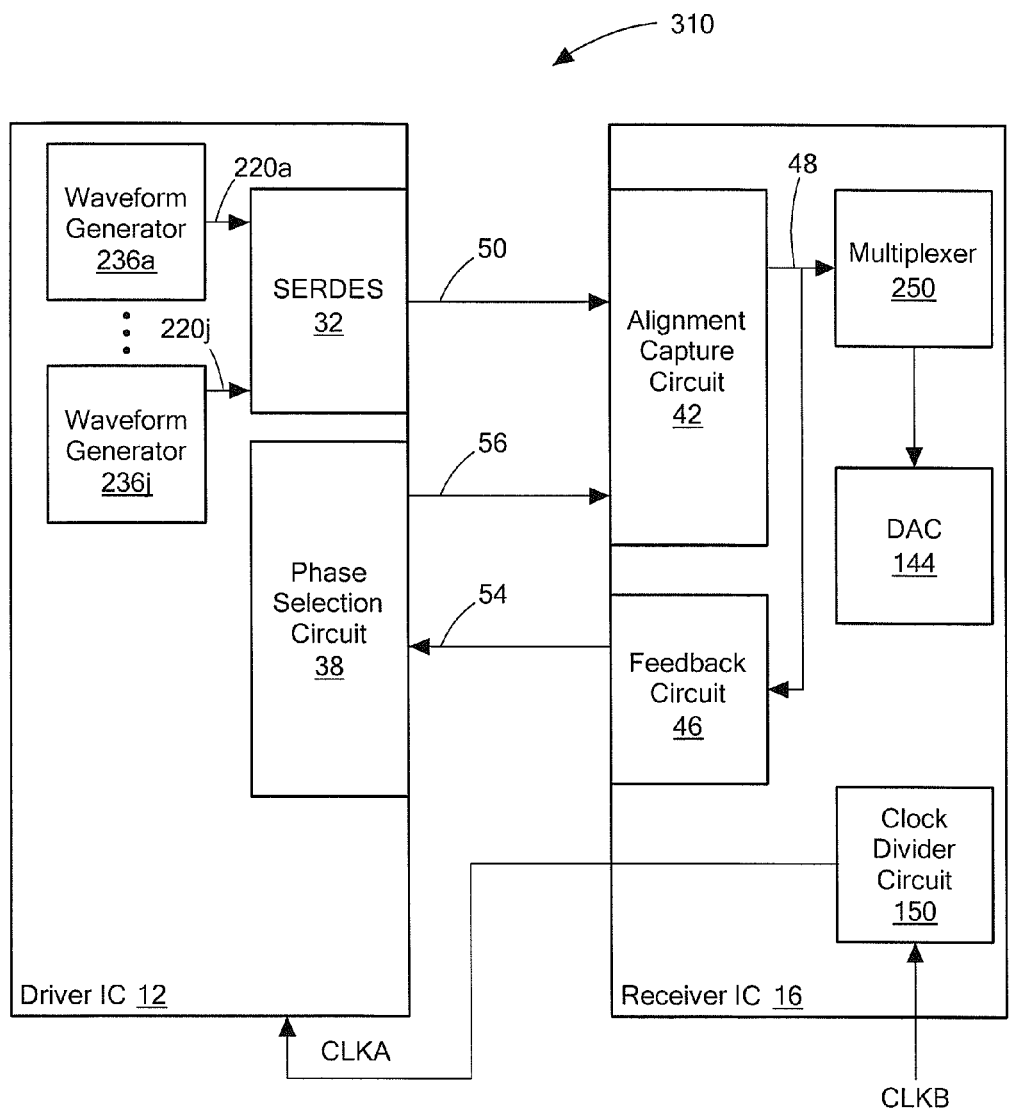
FIG. 7 is a block diagram of another example of the IC system.

Referring to FIG. 7, in another example, the two-IC system 10 may be implemented as two-IC system 310. The two-IC system 310 includes J waveform generators (e.g., a waveform generator 236a, . . . , and a waveform generator 236J) as the data source 36 in the driver IC 12 where J>1. In one example J=16. In another example, J=32. The J waveform generators are connected to the SERDES 32. For example, the waveform generator 236a is connected to SERDES 32 by the connection 236a and the waveform generator 236J is connected to the SERDES 32 by the connection 220J. In the two-IC system 310, the receiver IC 16 includes the DAC 144 as the data component 44 and a clock divider circuit 150. The receiver circuit further includes a multiplexer 250 (e.g., a 2:1 multiplexer). In one example, the J waveform generators are programmable.

In one particular example, the clock speed CLKB is 22.4 GHz and the clock divider circuit 150 divides the clock speed CLKB by 32 to 700 MHz which is provided to the driver circuit 12 as a clock signal CLKA. The SERDES 32 sends data signals DD over the connection 50 at 11.2 GHz. In this particular example, each of the J waveform generators 236 produce 12 bit signals and the SERDES includes 24 channels so that the connection 50 includes 2*12 or 24 channels. The align and capture circuit 42 provides a 24-bit signal to the multiplexer 250 which in the case of a 2:1 multiplexer supplies a 12-bit signal to the DAC 144.

The two-IC system 210 and the two-IC system 310 are each capable of generating continuous wave (CW) and linear frequency modulation (LFM; also referred to as chirp) waveforms, as well as synthesizing signals such as multitone, quadrature amplitude modulation (QAM) and pseudo random waveforms. The two-IC system 210 and the two-IC system 310 can each also generate AM waveforms; high data rate binary phase shift keyed (BPSK) and quadrature phase shift keyed (QPSK) waveforms; pre-distorted or filtered waveforms; and multiple simultaneous tones by incorporating the appropriate algorithms into the driver IC 12, by utilizing the RAM (external RAM 462 or internal RAM 460 to the IC 12) or by utilizing a receive bus to input digital waveforms into the driver IC 12. The two-IC system 210 and the two-IC system 310 can each also synthesize waveforms from DC to K-band.

Figure 8:
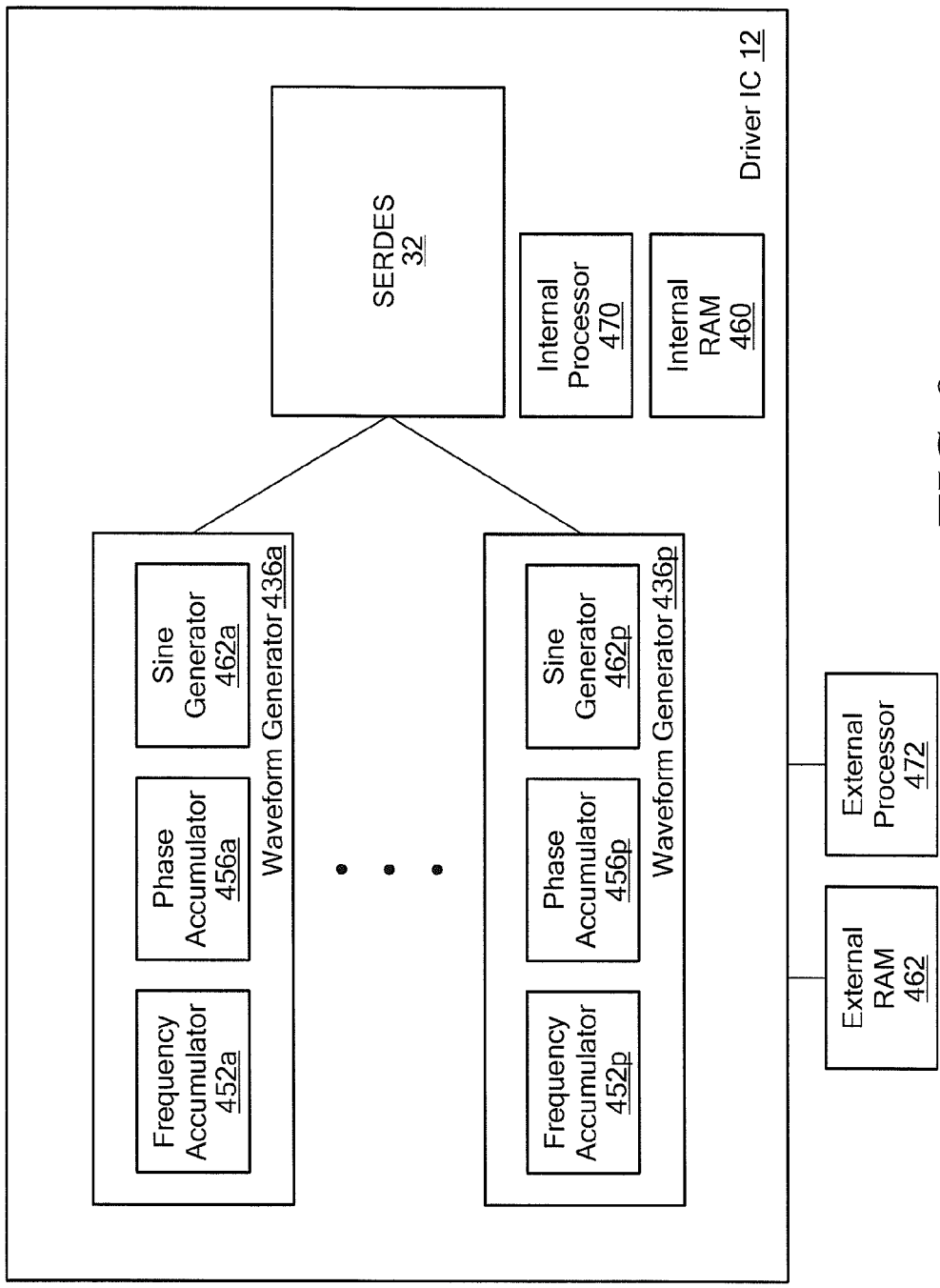
FIG. 8 is a block diagram of an example of a driver IC.

Referring to FIG. 8, in one example, the driver IC 12 includes sixteen waveform generators (e.g., a waveform generator 436a, . . . , and a waveform generator 436p) connected to the SERDES 32. Each waveform generator includes a frequency accumulator, a phase accumulator and a sine generator. For example, waveform generator 436a includes a frequency accumulator 452a, a phase accumulator 456a and a sine generator 462a and waveform generator 436p includes a frequency accumulator 452p, a phase accumulator 456p and a sine generator 462p. The driver IC 12 may also include an internal RAM 460 and a separate digital signal processor 470. The driver IC 12 may also be coupled to an external digital signal processor 472 (such as a computer or an FPGA outside the two IC system 10) and external memory 462.

Figure 9:
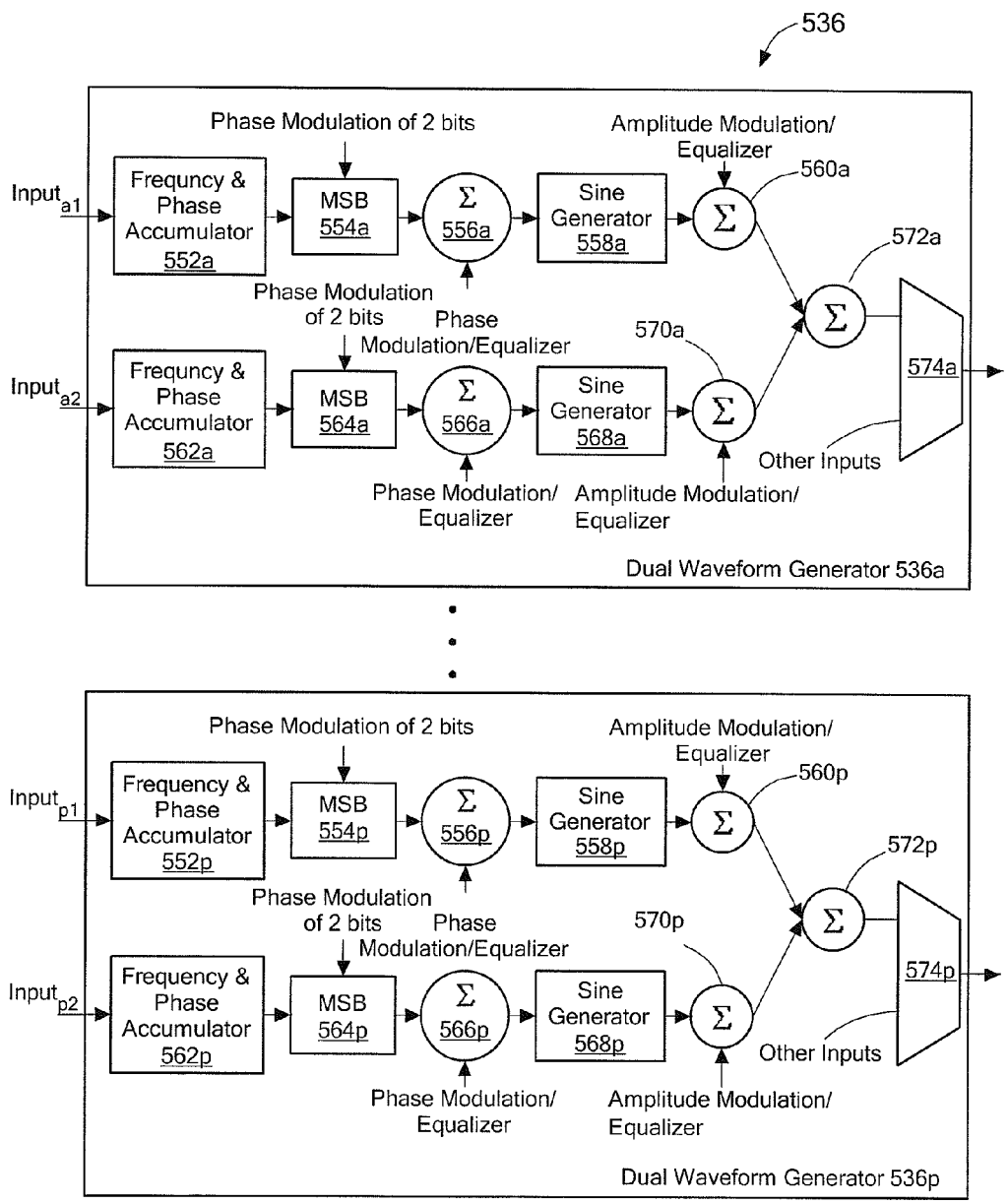
FIG. 9 is a block diagram of an example of arbitrary waveform generators.

Referring to FIG. 9, in another example, the driver IC may include sixteen dual waveform generators 536 (e.g., a dual waveform generator 536a, . . . , and a dual waveform generator 536p). For example, the dual waveform generator 536a includes for each of two waveforms, a frequency and phase accumulator 552a, 562a, a two most significant bit (MSB) component 554a, 564a, a summer 556a, 566a, a sine generator 558a, 568a and a summer 560a, 570a. The dual waveform generator 536a further includes a summer 572a and a multiplexer 574a. The remaining 16 dual waveform generators include similar components as the dual waveform generator 536a. For example, the waveform generator 536p includes frequency and phase accumulators 552p, 562p, two most significant bit (MSB) components 554p, 564p, summers 556p, 566p, sine generators 558p, 568p, summer 560p, 570p, a summer 572p and a multiplexer 574p. An architecture consisting of dual waveform generators enables the synthesis, for example, of two-tone signals.

In order to explain the operation of the arbitrary waveform generator 536, the dual waveform generator 536a is described. With respect to one of the dual waveform generators, the frequency and phase accumulator 552a receives an input signal, $INPUT_{a1}$.

For example, the input signal, $INPUT_{a1}$ includes a start frequency, start phase and a chirp slope. The two most significant bits, based on bi phase or quad phase modulation, are encoded. At the summer 556a, the resultant signal from the MSB module 554a is phase modulated and equalized to a first set of data. The resultant signal from the summer 556a is sent to the sine generator 558a. The resultant signal from the sine generator 558a is sent to the summer 560a where it is amplitude modulated and equalized to the first set of data. The resultant signal from the summer 560a is sent to the summer 572a. Likewise, the second waveform generator within the dual waveform generator includes the same operation as the first generator except the inputs, (e.g., an input to the frequency & phase accumulator 562a, $INPUT_{a2}$) to the second generator can be independent from the inputs to the first generator. The summer 572 combines the signals from the first and second waveform generators (i.e., from the summer 560a and the summer 570a respectively).

The multiplexer 574a receives the output from the summer 572a along with other inputs such as, for example, as shown in FIG. 8, from the external digital signal processor 472 (such as a computer or an FPGA outside the two IC system 10), the internal RAM 460, the external memory 462 and/or the separate digital signal processor 470 in the driver IC 12 which synthesizes a pseudo random waveform. The output of the multiplexer 574a is sent to the SERDES 32. The operation of the other two-tone waveform generators is similar to the dual waveform generator 536a. For example, the dual waveform generator 536p receives input signals $INPUT_{p1}$ and $INPUT_{p2}$, as well as the other inputs indicated in FIG. 9.

Figure 10:
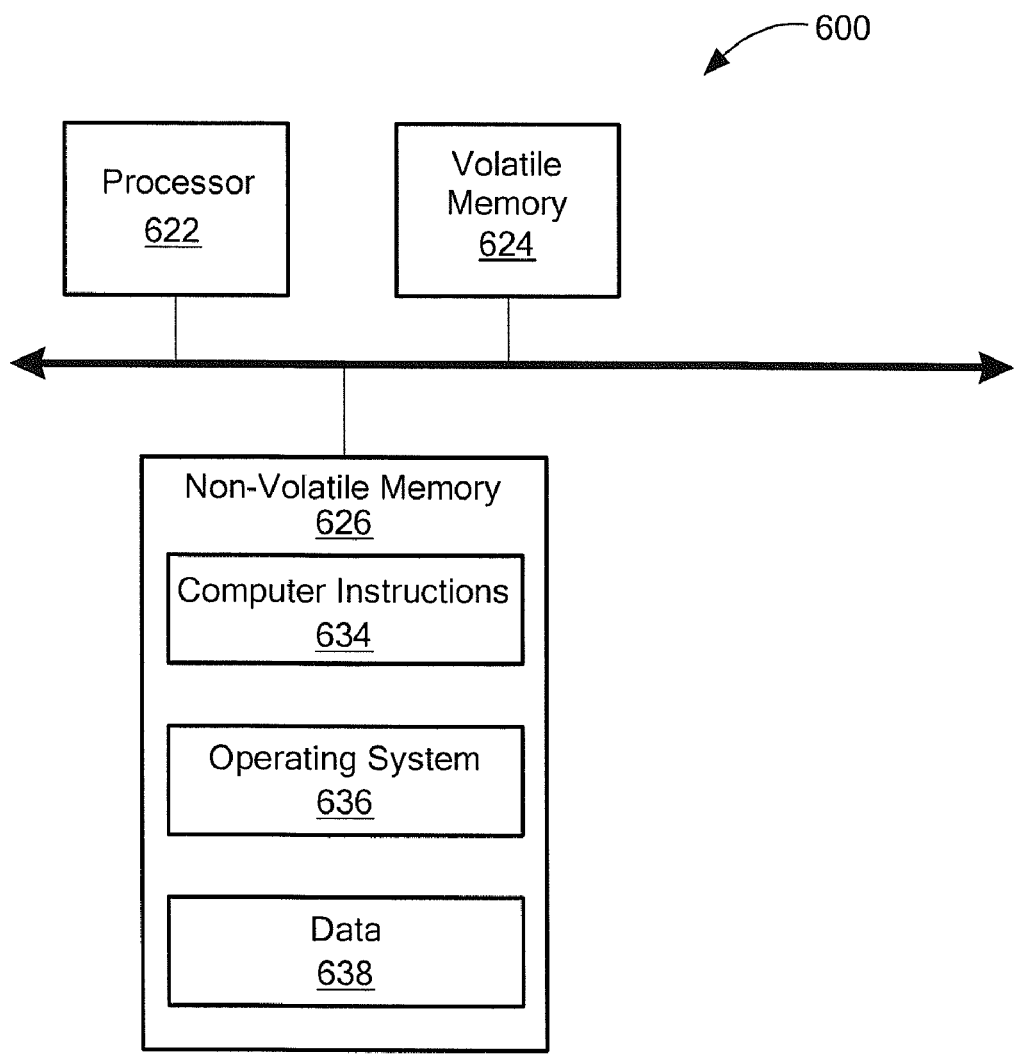
FIG. 10 is a block diagram of an example of an implementation to perform portions of the process of FIG. 5.

Referring to FIG. 10, an example of an implementation to perform subprocess 100a of FIG. 5 and/or subprocess 100b is a computer 600. In one example, the computer 600 may be disposed on each of the driver IC 12 (e.g., to perform process 100a) and/or the receiver IC 16 (e.g., to perform process 100b). The computer 200 includes a processor 622, a volatile memory 624 and a non-volatile memory 626. The non-volatile memory 626 stores computer instructions 634, an operating system 636 and data 638. In one example, the computer instructions 634 are executed by the processor 622 out of volatile memory 624 to perform all or part of the processes described herein (e.g., the process 100).

The processes described herein (e.g., the process 100) are not limited to use with the hardware and software configuration shown in FIG. 10; they may find applicability in any computing or processing environment and with any type of machine or set of machines that are capable of running a computer program. The processes described herein may be implemented in hardware, software, or a combination of the two. The processes described herein may be implemented as a set or subset of services in computer programs executed on programmable computers/machines that each includes a processor, a storage medium or other article of manufacture that is readable by the processor (including volatile and non-volatile memory and/or storage elements), at least one input device, one or more output devices, and a network connection. Program code may be applied to data entered using an input device to perform the processes described herein and to generate output information.

The system may be implemented, at least in part, via a computer program product, (e.g., in a machine-readable storage device), for execution by, or to control the operation of, data processing apparatus (e.g., a programmable processor, a computer or multiple computers)). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer to perform the processes described herein (e.g., the process 100). The processes described herein may also be implemented as a machine-readable storage medium, configured with a computer program, where upon execution, instructions in the computer program cause the computer to operate in accordance with the processes.

The processes described herein are not limited to the specific embodiments described. For example, the process 100 is not limited to the specific processing order of FIG. 5. Rather, any of the processing blocks of FIG. 5 may be re-ordered, combined or removed, performed in parallel or in serial, as necessary, to achieve the results set forth above.

The processing blocks in FIG. 5 associated with implementing the system may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)). In one example, logic in the FPGA could also be implemented entirely without a microprocessor or microcontroller.

Elements of different embodiments described herein may be combined to form other embodiments not specifically set forth above. Other embodiments not specifically described herein are also within the scope of the following claims.

What is claimed is:

1. An integrated circuit (IC) system, comprising:
   a receiver IC configured to receive a first clock signal external to the receiver IC, comprising a feedback circuit to provide a feedback signal to a driver IC; and
   the driver IC configured to receive a second clock signal, comprising a phase selection circuit configured to provide a phase selection signal to the receiver IC based on the feedback signal,
   wherein the phase selection signal controls the data received by the receiver IC by adjusting the first clock signal.

2. The IC system of claim 1 wherein the driver IC further comprises a serializer/deserializer (SERDES) configured to provide data to the receiver IC.

3. The IC system of claim 1 wherein the receiver IC comprises an indium phosphide (InP) substrate.

4. The IC system of claim 3 wherein the driver IC comprises a silicon substrate.

5. The IC system of claim 1 wherein the driver IC is further configured to provide data to the receiver IC originating from a waveform generator.

6. The IC system of claim 1 wherein the first clock signal is a multiple of the second clock signal.

7. The IC system of claim 1 wherein the receiver IC further comprises a divider circuit configured to divide the first clock signal to form the second clock signal provided to the driver IC.

8. The IC system of claim 1 wherein the feedback circuit comprises:
   an AND gate;
   a first D flip-flop configured to receive an output of the AND gate at a D port of the first flip-flop; and
   a second D flip-flop configured to receive at a clock port an output of a Q port of the first flip-flop and configured to provide the feedback signal at a port of the second flip-flop.

9. The IC system of claim 1 wherein the receiver IC further comprises an align and capture circuit, the align and capture circuit comprises:
   a buffer configured to receive data and differential data;
   a multiplexer configured to receive the first clock signal and an inverted first clock signal, the multiplexer being controlled by the phase selection signal; and
   a D flip-flop configured to:
      receive an output of the buffer at a D port of the D flip-flop;
      receive an output of the multiplexer at a clock port of the D flip-flop; and
      generate from the Q port of the D flip-flop a portion of a signal.

10. The IC system of claim 1 wherein adjusting the first clock signal comprises selecting which portion of the first clock signal is utilized.

11. The IC system of claim 10 wherein selecting which portion of the first clock signal is utilized comprises selecting a leading edge of the first clock signal or a falling edge of the first clock signal.

12. A driver integrated circuit (IC) configured to provide data to a receiver IC, the driver IC comprising:
   a phase selection circuit configured to provide a phase selection signal to the a receiver IC in response to a feedback signal received from the receiver IC, the receiver IC receiving a first clock signal external to the receiver IC,
   wherein the phase selection signal controls the data received by the receiver IC by selecting which portion of the first clock signal is utilized.

13. The driver IC of claim 12, further comprising a serializer/deserializer (SERDES) configured to provide the data to the receiver IC.

14. The driver IC of claim 13 wherein the driver IC comprises a silicon substrate.

15. The driver IC of claim 12 wherein selecting which portion of the first clock signal is utilized comprises selecting a leading edge of the first clock signal or a falling edge of the first clock signal.

16. A receiver integrated circuit (IC) comprising:
   a feedback circuit configured to provide a feedback signal to a driver IC,
   wherein the receiver IC is configured to receive a phase selection signal from the driver circuit in response to the feedback signal and is configured to receive data from the driver IC,
   wherein the phase selection signal controls the data received by the receiver IC by selecting which portion of the first clock signal is utilized,
   wherein the receiver IC is configured to receive a first clock signal external to the receiver IC.

17. The receiver IC of claim 16 wherein the receiver IC comprises an indium phosphide (InP) substrate.

18. The receiver IC of claim 16, further comprising a divider circuit configured to divide the first clock signal provided to the receiver IC to form a second clock signal provided to the driver IC.

19. The receiver IC of claim 16 wherein the feedback circuit comprises:
   an AND gate;
   a first D flip-flop configured to receive an output of the AND gate at a D port of the first flip-flop; and
   a second D flip-flop configured to receive at a clock port an output of a Q port of the first flip-flop and configured to provide the feedback signal at a port of the second flip-flop.

20. The receiver IC of claim 16, further comprising an align and capture circuit, the align and capture circuit comprises:
   a buffer configured to receive data and differential data;
   a multiplexer configured to receive the first clock signal and an inverted first clock signal, the multiplexer being controlled by the phase selection signal; and
   a D flip-flop configured to:
      receive an output of the buffer at a D port of the D flip-flop;
      receive an output of the multiplexer at a clock port of the D flip-flop; and
      generate from the Q port of the D flip-flop a portion of a signal.

21. The receiver IC of claim 16 wherein selecting which portion of the first clock signal is utilized comprises selecting a leading edge of the first clock signal or a falling edge of the first clock signal.

* * * * *

UNITED STATES PATENT AND TRADEMARK OFFICE
CERTIFICATE OF CORRECTION

PATENT NO.       : 8,319,523 B2
APPLICATION NO.  : 12/821730
DATED            : November 27, 2012
INVENTOR(S)      : Stephen R. Reid et al.

Page 1 of 1

It is certified that error appears in the above-identified patent and that said Letters Patent is hereby corrected as shown below:

In the Drawings:

Delete FIG. 4 sheet 4 of 10 and replace with the FIG. 4 sheet 4 of 10 as shown below.

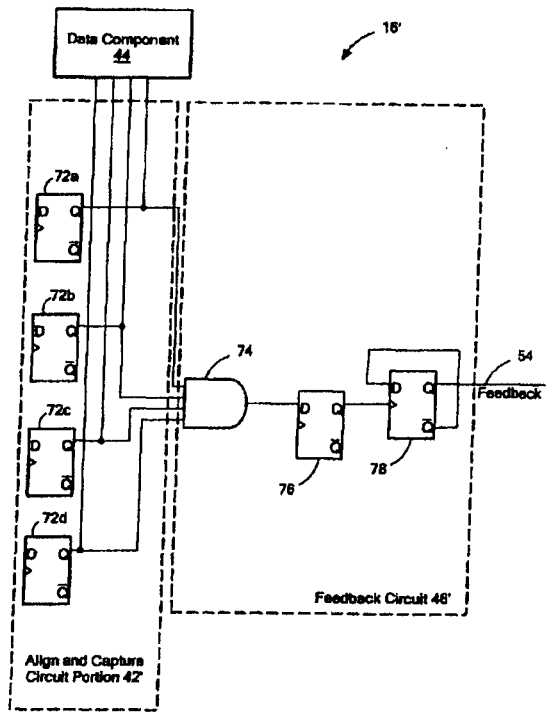

FIG. 4

Signed and Sealed this
Ninth Day of July, 2013

Teresa Stanek Rea
*Acting Director of the United States Patent and Trademark Office*